(12) United States Patent
Ohtomo

(10) Patent No.: US 8,669,739 B2
(45) Date of Patent: Mar. 11, 2014

(54) ELECTRIC CHARGING SYSTEM, ELECTRIC VEHICLE AND ELECTRIC CHARGER

(75) Inventor: Yosuke Ohtomo, Tokyo (JP)

(73) Assignee: Fuji Jukogyo Kabushiki Kaisha, Tokyo (JP)

( * ) Notice: Subject to any disclaimer, the term of this patent is extended or adjusted under 35 U.S.C. 154(b) by 3 days.

(21) Appl. No.: 13/533,887

(22) Filed: Jun. 26, 2012

(65) Prior Publication Data

US 2013/0009598 A1    Jan. 10, 2013

(30) Foreign Application Priority Data

Jul. 5, 2011 (JP) .................................. 2011-148831

(51) Int. Cl.
*H02J 7/00* (2006.01)
*H02J 7/04* (2006.01)
*B60L 1/00* (2006.01)
*B60K 1/00* (2006.01)

(52) U.S. Cl.
USPC .......... 320/109; 320/104; 320/132; 307/10.1; 180/65.1

(58) Field of Classification Search
USPC ......... 320/104, 109, 134, 138, 160; 307/10.1, 307/72, 75, 80, 84, 85, 87; 180/65.1
See application file for complete search history.

(56) References Cited

U.S. PATENT DOCUMENTS

| | | | | |
|---|---|---|---|---|
| 6,294,845 | B1 * | 9/2001 | Yoshida et al. | 307/10.6 |
| 6,897,370 | B2 * | 5/2005 | Kondo et al. | 136/243 |
| 8,159,184 | B2 * | 4/2012 | Emori et al. | 320/116 |
| 8,258,744 | B2 * | 9/2012 | Ishii et al. | 320/104 |
| 8,401,738 | B2 * | 3/2013 | Nakai | 701/42 |
| 2003/0209375 | A1 * | 11/2003 | Suzuki et al. | 180/65.3 |
| 2004/0164619 | A1 * | 8/2004 | Parker et al. | 307/80 |
| 2007/0069579 | A1 * | 3/2007 | Bailey | 307/10.1 |
| 2011/0279082 | A1 * | 11/2011 | Hagenmaier et al. | 320/109 |

FOREIGN PATENT DOCUMENTS

JP    2010-238576 A    10/2010

* cited by examiner

*Primary Examiner* — Edward Tso
*Assistant Examiner* — Alexis Boateng
(74) *Attorney, Agent, or Firm* — McGinn IP Law Group, PLLC

(57) ABSTRACT

There are provided an electric charging system, an electric vehicle and an electric charger. Upon charging a battery, power supply lines of an electric charger are connected to the power receiving lines of an electric vehicle 12. The power receiving lines have a relay. The electric charger has a voltage sensor that measures a voltage between the power supply lines. The electric charger has a voltage processing portion that applies filtering to the voltage. Upon charging when charging power is supplied from the electric controller, a filtering process with a stability-oriented first filter is applied to the voltage. Upon a relay failure diagnosis that performs a failure diagnosis of the relay based on a change in the voltage due to opening and closing of the relays, a filtering process with a second filter that has a higher responsiveness is applied to the voltage.

3 Claims, 12 Drawing Sheets

ELECTRIC CHARGING SYSTEM, ELECTRIC VEHICLE AND ELECTRIC CHARGER

CROSS REFERENCES TO RELATED APPLICATIONS

The present application claims priority from Japanese Patent Application No. 2011-148831 filed on Jul. 5, 2011, the entire contents of which are hereby incorporated by reference.

BACKGROUND OF THE INVENTION

1. Field of the Invention

The present invention relates to an electric charging system, an electric vehicle and an electric charger, and, in particular, to a technology that checks for a failure of a relay provided to an electric vehicle.

2. Description of the Related Art

In recent years, electric vehicles that are equipped with an electric motor for propulsion have been under development. The electric vehicle is equipped with an electric storage device such as battery. Upon charging the electric storage device, a charging cable extending from an external electric charger is connected to a charging port of the electric vehicle. Furthermore, in the field of hybrid electric vehicles that are equipped with an engine and an electric motor for propulsion, so called a plug-in type vehicle is under development whose electric storage device is charged with an external electric charger. Since a terminal voltage of the electric storage device is applied to the charging port provided to the electric vehicle, it is necessary to ensure safety during a charging operation that exposes the charging port. Thus, a relay is provided to a power supply line that connects the electric storage device and the charging port. When the charging operation is not performed, the relay is disconnected, thereby protecting the terminal voltage from being applied to the charging port.

Since a large current is supplied during charging to the relay thus provided on the power supply line for ensuring safety, a weld failure or fusion failure may occur at the relay. Thus, an electric charging system is proposed that switches the relay to a disconnection state after charging is complete as well as monitors a voltage change due to the relay disconnection (see, for example, Japanese Unexamined Patent Application Publication (JP-A) No. 2010-238576). By using such an electric charging system, it is possible to detect a weld failure of the relay.

The electric charging system described in JP-A No. 2010-238576 checks for a weld failure of a relay using a voltage sensor disposed in an electric charger. Upon using a voltage output from the voltage sensor, it is necessary to perform a filtering process such as moving average to remove noise from the voltage. However, the voltage detected by the voltage sensor is used for charging control of an electric storage device in addition to for a relay failure diagnosis, it is difficult to set a filtering characteristic for processing the voltage.

Specifically, upon charging when high charging power is supplied, large noise is generated and thus a filter characteristic is required that emphasizes on stability. On the other hand, upon the relay failure diagnosis when power supply is interrupted, a filter characteristic is required that emphasizes responsiveness. Therefore, if a filtering characteristic emphasizing stability is set, it is difficult to swiftly perform the relay failure diagnosis. On the other hand, if a filtering characteristic emphasizing responsiveness is set, stability of a voltage that is filtered upon charging is impaired.

SUMMARY OF THE INVENTION

The present invention is made in view of the above, and it is an object of the present invention to swiftly perform a relay failure diagnosis without impairing stability of a voltage that is filtered upon charging.

An aspect of the present invention provides an electric charging system in which an electric vehicle is provided with a charging port that is connected to an electric storage device, an electric charger that has an electric controller generating supply power is connected to the charging port, and the electric charger is used to charge the electric storage device. The electric charging system includes: a pair of current carrying lines that connects the electric storage device and the power controller via the charging port and supplies charging power to the electric storage device from the power controller; a relay that is disposed on at least either one of the pair of the current carrying lines between the electric storage device and the charging port and is switched between a connection state and a disconnection state; a voltage measure that is connected to the pair of the current carrying lines between the relay and the power controller and measures a voltage between the current carrying lines; a relay diagnosis unit that, under a state where charging of the electric storage device is interrupted, switches the relay to the connection state or the disconnection state and examines a failure state of the relay based on a change in the voltage due to switching of the relay; and a voltage processor that processes the voltage with a first filter when the electric storage device is charged and processes the voltage with a second filter that has a higher responsiveness than the first filter when a failure diagnosis of the relay is performed based on the change in the voltage due to switching of the relay.

Another aspect of the present invention provides an electric vehicle that has a charging port detachably connected to an electric charger and is equipped with an electric storage device connected to the charging port via a pair of current carrying lines. The electric vehicle includes: a relay that is disposed on at least either one of the pair of the current carrying lines and is switched between a connection state and a disconnection state; a voltage measure that is connected to the pair of the current carrying lines between the relay and the charging port and measures a voltage between the current carrying lines; and a voltage processor that processes the voltage measured by the voltage measure with a predetermined filter. The voltage processor processes the voltage with a first filter when the electric charger is connected to the charging port to charge the electric storage device. The voltage processor processes the voltage with a second filter that has a higher responsiveness than the first filter when, under a state the power supply from the power controller is interrupted, the relay is switched to a connection state or a disconnection state and a failure diagnosis of the relay is performed based on a change in the voltage due to switching of the relay.

Another aspect of the present invention provides an electric charger that, when in use, is connected to an electric vehicles that includes an electric storage device connected to a charging port via a pair of power receiving lines and a relay disposed on at least either of the pair of the power receiving lines. The electric charger includes: a connector that is attachable and detachable to the charging port; a power controller that is connected to the connector via a pair of power supply lines and generates charging power; a voltage measure that is connected to the pair of the power supply lines and measures a voltage between the power supply lines; and a voltage processor that processes the voltage measured by the voltage measure with a predetermined filter. The voltage processor processes the voltage with a first filter when the power controller supplies supply power from the power controller to charge the electric storage device under a state where the connector is connected to the charging port. The voltage processor processes the voltage with a second filter that has a higher responsiveness than the first filter when, under a state the connector is connected to the charging port and the power supply from the power controller is interrupted, the relay is switched to a connection state or a disconnection state and a failure diagnosis of the relay is performed based on a change in the voltage due to switching of the relay.

According to the present invention, the voltage is processed with the first filter upon charging the electric storage device while the voltage is processed with the second filter that has a higher responsiveness when the failure diagnosis of the relay is performed. As a result, it is possible to swiftly perform the failure diagnosis of the relay upon charging without impairing stability of the voltage which is filtered.

DESCRIPTION OF THE PREFERRED EMBODIMENTS

Figure 1:
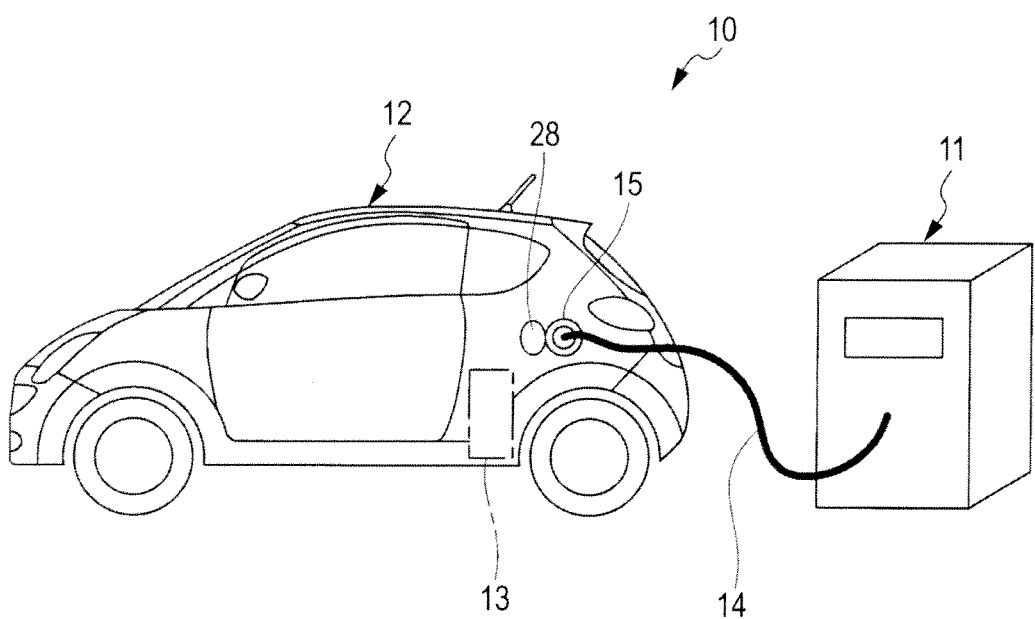
FIG. 1 is an explanatory diagram showing a case in which charging is preformed with an electric charging system and an electric charger according to an embodiment of the present invention.
Figure 2:
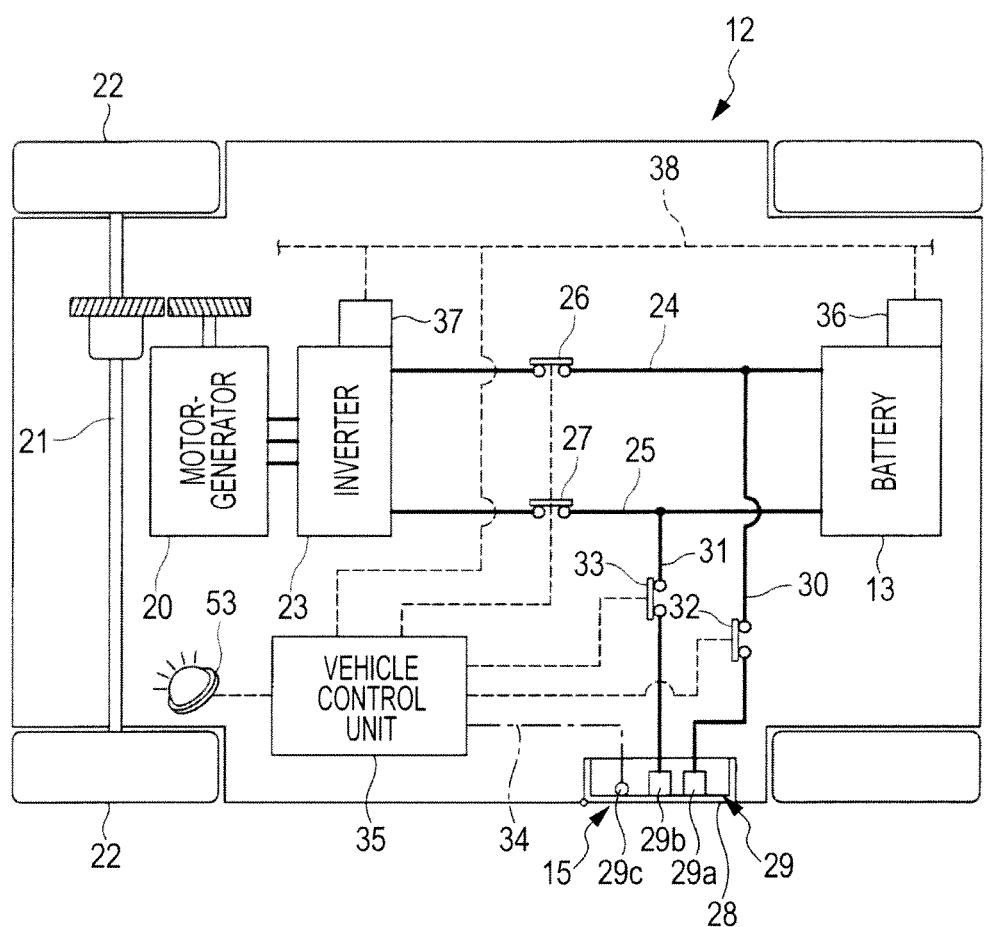
FIG. 2 is a schematic diagram showing an internal structure of an electric vehicle constituting the electric charging system.
Figure 3:
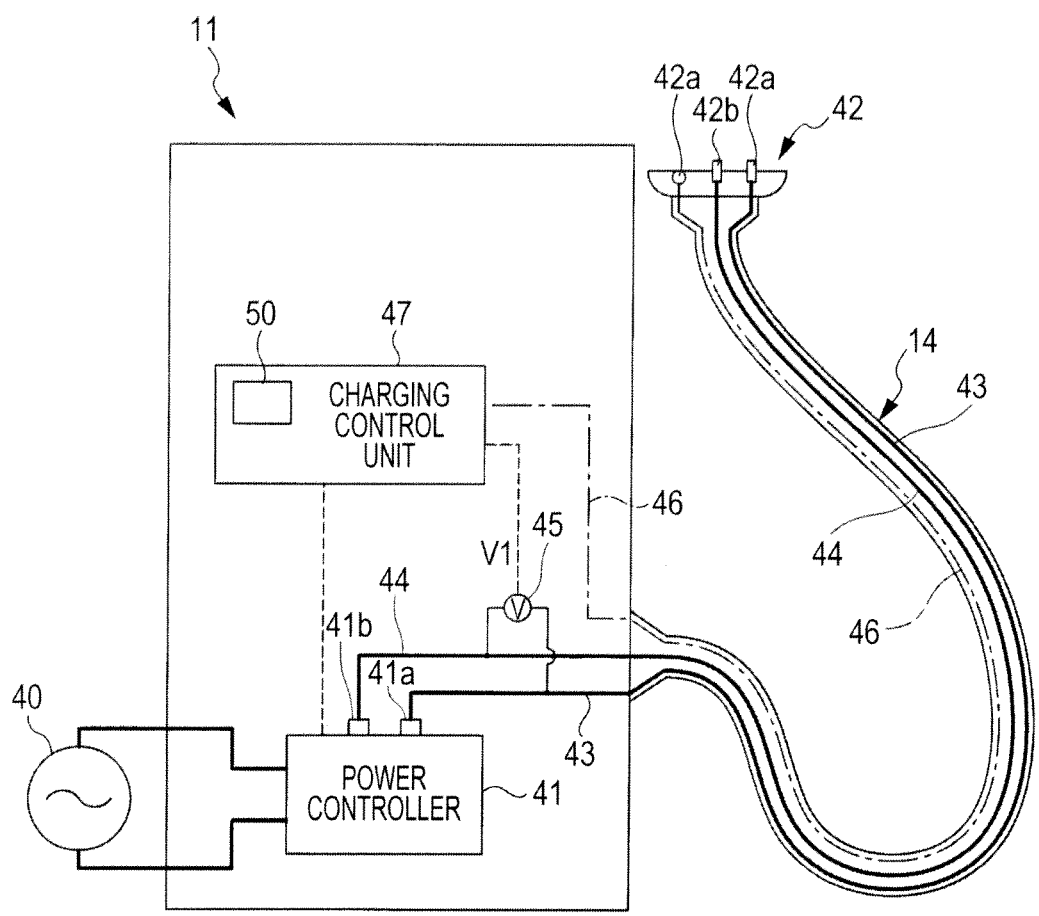
FIG. 3 is a schematic diagram showing an internal structure of an electric charger constituting the electric charging system.

An embodiment of the present invention will hereunder be described with reference to the drawings. FIG. 1 is an explanatory diagram showing a case in which charging is preformed with an electric charging system 10 and an electric charger 11 according to an embodiment of the present invention. FIG. 2 is a schematic diagram showing an internal structure of an electric vehicle 12 constituting the electric charging system 10. FIG. 3 is a schematic diagram showing an internal structure of the electric charger 11 constituting the electric charging system 10. As shown in FIG. 1, the electric vehicle 12 is equipped with a battery 13 as an electric storage device. When the battery 13 is charged, a charging cable 14 of the electric charger 11 is connected to a charging port 15 of the electric vehicle 12.

As shown in FIG. 2, the electric vehicle 12 includes a motor-generator 20 for propulsion that is connected to drive wheels 22 via a drive axle 21. The motor-generator 20 is connected to the battery 13 via an inverter 23 that bidirectionally converts DC power and AC power. The battery 13 and the inverter 23 are connected by electric power lines 24 and 25. The electric power lines 24 and 25 have main relays 26 and 27 respectively. The charging port 15 of the electric vehicle 12 includes a charging lid 28 that is openably and closably disposed at a side of the vehicle body and a power receiving connector 29 that is housed inside the charging lid 28. The power receiving connector 29 has a pair of power receiving terminals 29a and 29b. The power receiving terminal 29a is connected to the electric power line 24 at a side of a positive electrode, via a power receiving line (current carrying line) 30. The power receiving terminal 29b is connected to the electric power line 25 at a side of a negative electrode, via a power receiving line (current carrying line) 31. The power receiving lines 30 and 31 have relays 32 and 33 respectively. The power receiving connector 29 has a signal receiving terminal 29c, and the signal terminal 29c is connected to a communication line 34. The electric vehicle 12 includes a vehicle control unit 35 that integrally controls the entire vehicle, a battery control unit 36 that controls the battery 13, and a motor control unit 37 that controls the inverter 23. The control units 35 to 37 are connected to each other via a communication network 38. Each of the control units 35 to 37 is equipped with a CPU, a memory and the like. As shown in FIG. 3, the electric charger 11 has a power controller 41 that converts AC power from an external power source 40 to DC power (charging power). The power controller 41 includes a rectifier circuit, an electric transformer, a switching circuit and the like. An end of the charging cable 14 of the electric charger 11 is provided with a power supply connector (connector) 42 that is attachable and detachable with respect to the power receiving connector 29. The power supply connector 42 has a pair of power supply terminals 42a ant 42b that correspond to the power receiving terminals 29a and 29b of the power receiving connector 29. The power supply terminal 42a is connected to a positive electrode terminal 41a of the power controller 41 via a power supply line (current carrying line) 43, while the power supply terminal 42b is connected to a negative electrode terminal 41b of the power controller 41 via a power supply line (current carrying line) 44. The electric charger 11 has a voltage sensor (voltage measure) 45 that measures a voltage V1 between the power supply lines 43 and 44. The power supply connector 42 has a signal terminal 42c that is connected to a communication line 46. The electric charger 11 includes a charging control unit 47 that is equipped with a CPU, a memory and the like. The charging control unit 47 controls the power controller 41.

Figure 4:
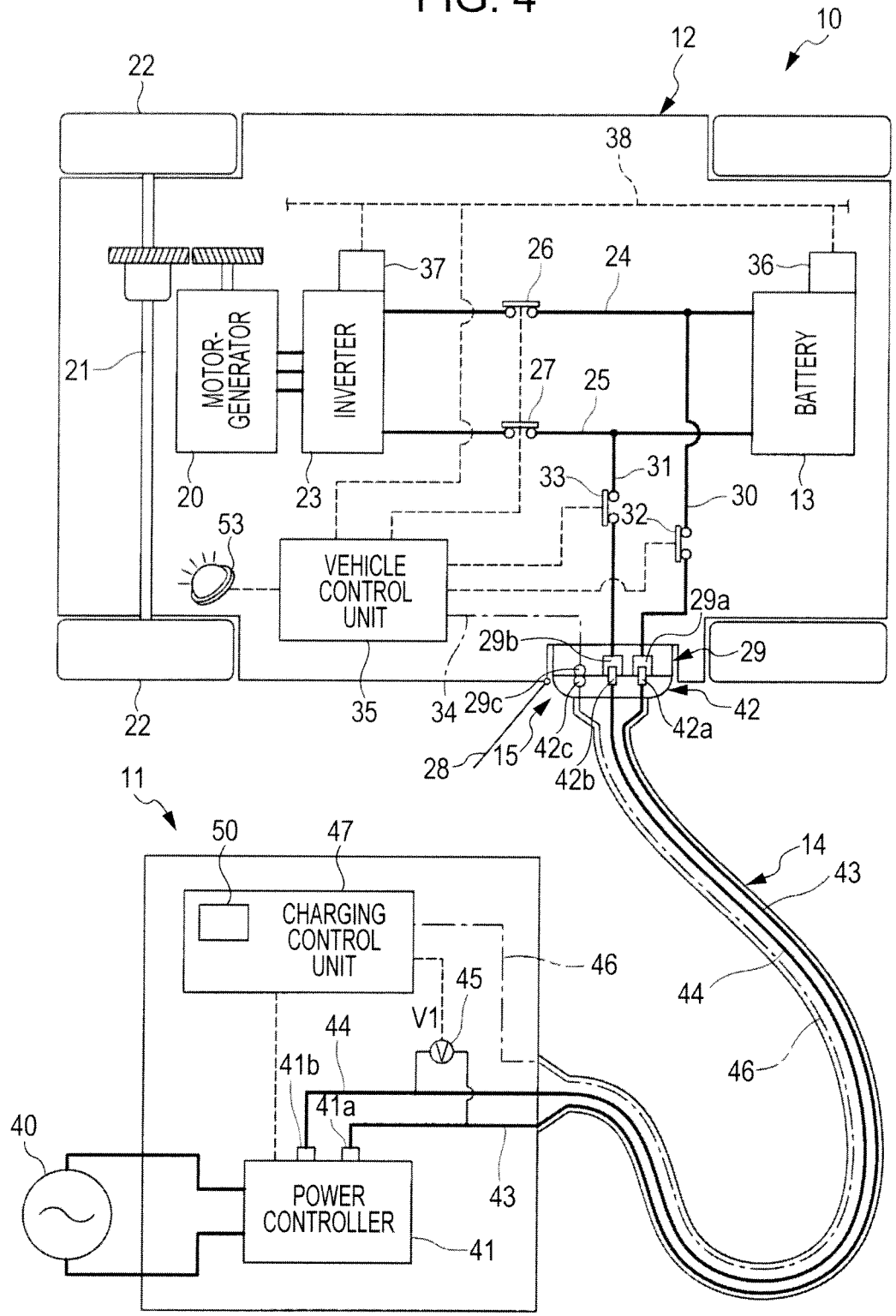
FIG. 4 is a schematic diagram showing a state where the electric charger is connected to the electric vehicle.
Figure 5:
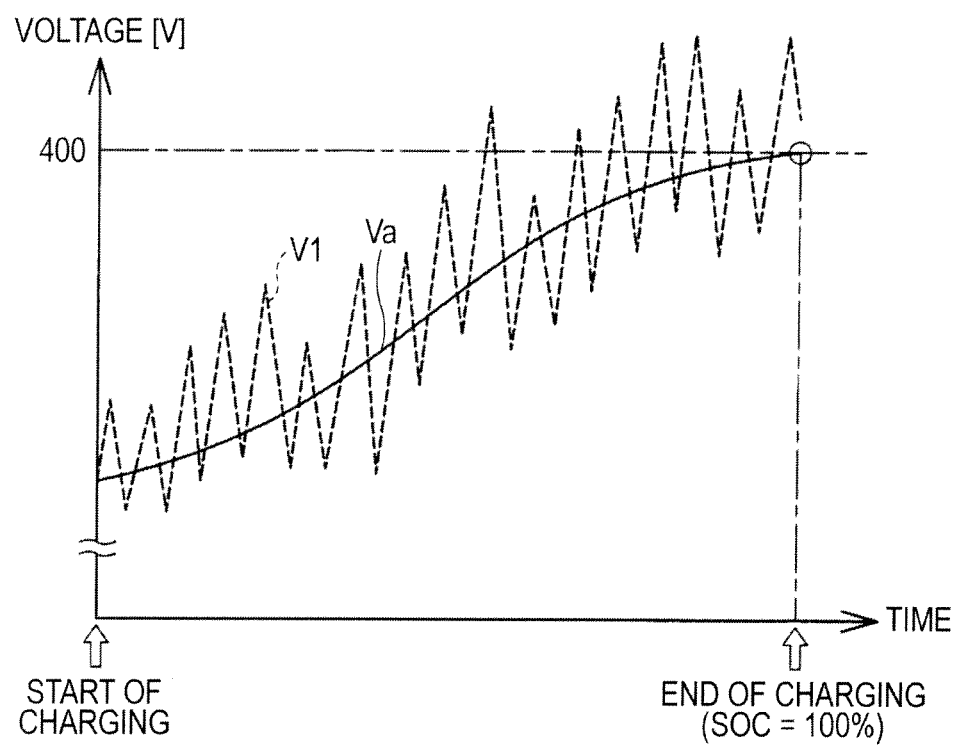
FIG. 5 is an explanatory diagram showing a change in a voltage upon charging.

FIG. 4 is a schematic diagram showing a state where the electric charger 11 is connected to the electric vehicle 12. As shown in FIG. 4, when the charging cable 14 is connected to the charging port 15, the power receiving connector 29 is exposed by opening the charging lid 28 disposed at the vehicle body, and the power supply connector 42 of the charging cable 14 is connected to the power receiving connector 29. Accordingly, the power controller 41 is connected to the battery 13 via the pair of the power supply lines 43 and 44 and the pair of the power receiving lines 30 and 31, while the vehicle control unit 35 is connected to the charging control unit 47 via the communication lines 34 and 46. Then the charging control unit 47 sets a target voltage (for example, 400 V) corresponding to a target state of charge (SOC) of the battery 13 (for example, 100%) and supplies charging power from the power controller 41 to the battery 13 until the terminal voltage of the battery 14 reaches to the target voltage. Upon charging in which the electric charger 11 is connected to the electric vehicle 12, the voltage V1 between the power supply lines 43 and 44, which is the terminal voltage of the battery 13, can be measured with the voltage sensor 45 of the electric charger 11. FIG. 5 is an explanatory diagram showing a change in the voltage V1 upon charging. As shown with a dashed line in FIG. 5, large charging power (400 V, 100 A for example) is supplied to the power supply lines 43 and 44 upon charging, and thus large noise is generated in the voltage output from the voltage sensor. The generation of such a noise causes an erroneous estimation of the terminal voltage of the battery 13, and thus it is necessary to apply a filtering process to the voltage V1 to remove the noise. Accordingly, as shown in FIGS. 3 and 4, the charging control unit 47 has a voltage processing unit (voltage processor) 50 that applies a predetermined filtering process to the voltage V1. The voltage processing unit 50 applies a filtering process using a first filter such as a moving average and a weighted average to the voltage 1 to remove the noise, thereby generating a voltage Va shown with a solid line in FIG. 5. By using the voltage Va which is generated by applying the filtering process using the first filter, it is possible to properly estimate the terminal voltage of the battery 13, thereby preventing an charging shortage or overcharging of the battery 13.

As described above, when the battery 13 of the electric vehicle 12 is charged, it is necessary to expose the power receiving connector 29 by opening the charging lid 28 and afterwards to connect the power supply connector 42 of the charging cable 14 to the power receiving connector 29. Accordingly, when the charging cable 14 is connected to the electric vehicle 12, the power receiving terminals 29a and 29b connected to the battery 13 are temporarily exposed. Thus, the power receiving lines 30 and 31 have the relays 32 and 33, which are also called contactors. Under the state where the power receiving terminal 29a and 29b are exposed, the relays 32 and 33 are controlled to be in a disconnection state. Therefore, the power receiving terminals 29a and 29b are not exposed with a high voltage being applied thereto, whereby safety is ensured upon a charging operation. Since large current is passed through the power receiving lines 30 and 31 during charging, a weld failure or a fusion failure may occur at the relays 32 and 33 of the power receiving lines 30 and 31. Thus, after the battery 13 is charged, the vehicle control unit 35 performs a relay diagnosis control to detect whether or not a weld failure or a fusion failure has occurred. The relay diagnosis control will be hereunder explained in detail.

Figure 6:
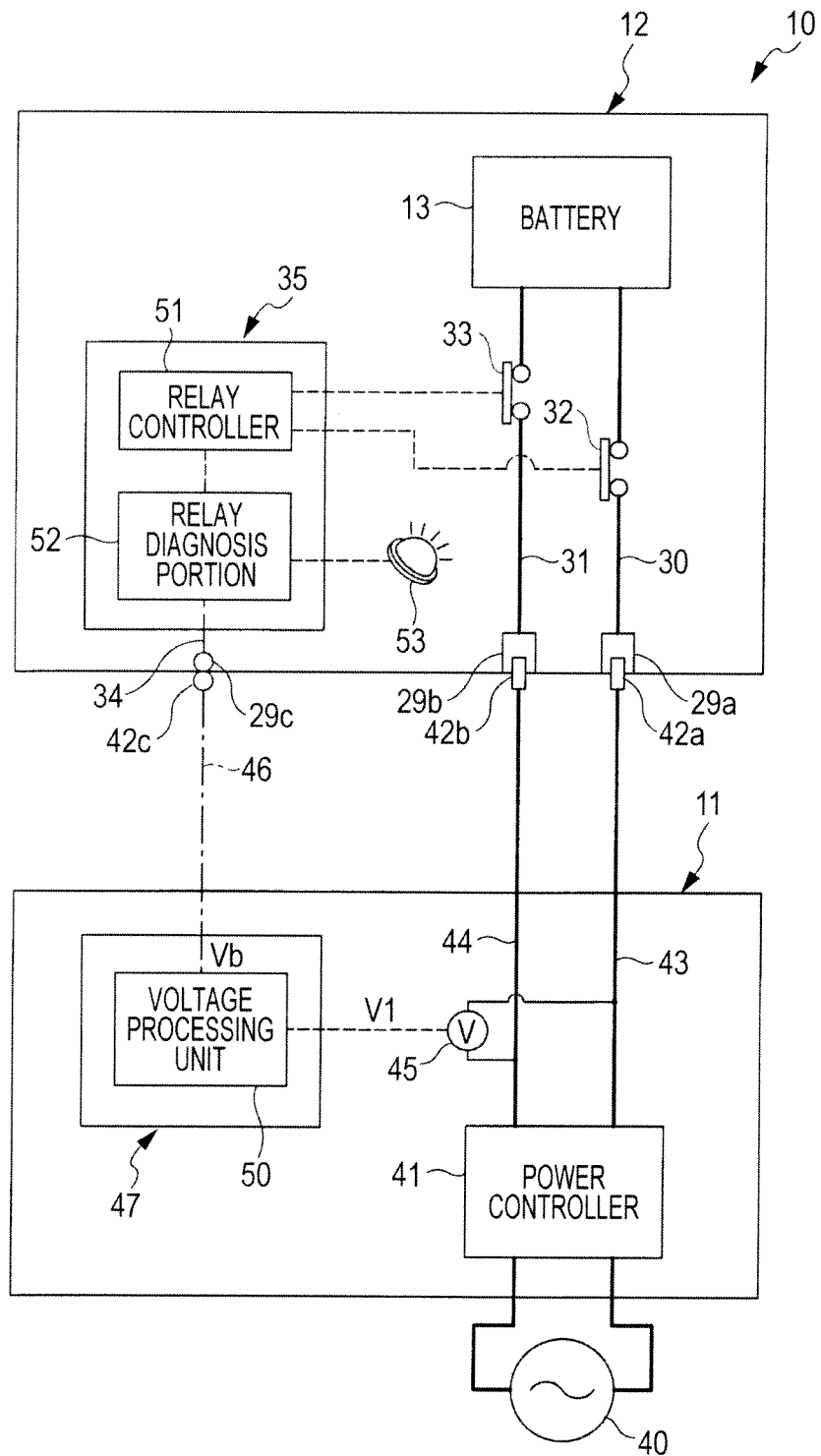
FIG. 6 is a schematic diagram showing main parts in the electric charging system that execute a relay diagnosis control.

FIG. 6 is a schematic diagram showing main parts in the electric charging system 10 that execute the relay diagnosis control. In FIG. 6, components that are identical to components shown in FIG. 4 are denoted by like reference numerals, and descriptions thereof are omitted. As shown in FIG. 6, the vehicle control unit 35 has a relay controller (relay diagnosis unit) 51 that controls the operation state of the relays 32 and 33. The relay controller 51 controls current conduction to an unillustrated magnet coil of the relays 32 and 33, and switches the relays 32 and 33 between a connection state and the disconnection state. The voltage processing unit 50 of the charging control unit 47 has a second filter that has a higher responsiveness than the above-mentioned first filter. The voltage processing unit 50 applies a filtering process using the second filter such as a moving average and a weighted average to the voltage 1 upon the relay diagnosis control to the voltage 1 to remove the noise, thereby generating a voltage Vb. The vehicle control unit 35 further has a relay diagnosis portion (relay diagnosis unit) 52 that detects an occurrence of a weld failure and a fusion failure in the relays 32 and 33. The relay diagnosis portion 52 receives control states of the relays 32 and 33 from the relay controller 51 as well as the voltage Vb which is generated by applying the filtering process from the voltage processing unit 50. The relay diagnosis portion 52 checks for a weld failure and a fusion failure in the relays 32 and 33 based on a change in the voltage Vb due to switching of the relays 32 and 33.

Figure 7:
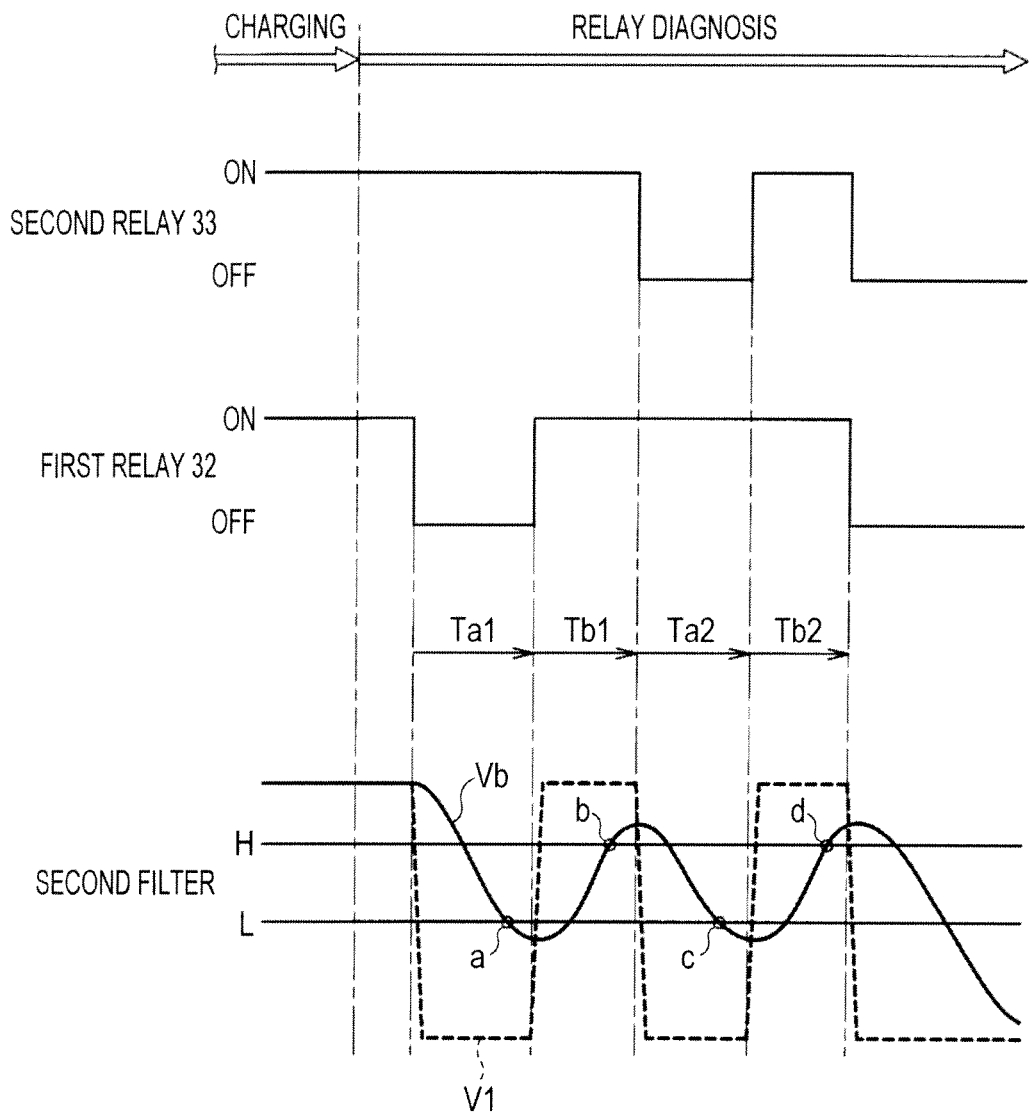
FIG. 7 is an explanatory diagram showing execution steps of the relay diagnosis control.

FIG. 7 is an explanatory diagram showing execution steps of the relay diagnosis control. In FIG. 7 the voltage V1 before filtering is shown with a dashed line, while the voltage Vb after filtering is shown with a solid line. In the following description, the relay 32 is referred to as a first relay, while the relay 33 is referred to as a second relay. As shown in FIG. 7, when charging of the battery 13 is complete, the first relay 32 is switched to the disconnection state (OFF) while the second relay 33 is kept in the connection state (ON). Then, it is determined whether or not the voltage Vb falls below a predetermined determination voltage L (for example, 270 V) within a predetermined period of time Ta1 (for example, one second) in which the first relay 32 is disconnected. When the voltage Vb falls below the determination voltage L within the predetermined period of time Ta1 (reference numeral a), that is, when a voltage drop between the power receiving terminals 29a and 29b is confirmed with the disconnection of the first relay 32, it is determined that no weld failure occurs at the first relay 32. On the other hand, when the voltage Vb does not fall below the determination voltage L within the predetermined period of time Ta1, that is, when the predetermined voltage drop is not confirmed with the disconnection of the first relay 32, it is determined that a weld failure occurs at the first relay 32. When a weld failure is thus detected, a warning lamp 53 illuminates to notify a driver of the occurrence of the failure. Then, the first relay 32 is switched to the connection state while the second relay 33 is kept in the connection state. It is determined whether or not the voltage Vb exceeds a predetermined determination voltage H (for example, 300 V) within a predetermined time Tb1 (for example, 0.5 seconds) in which the first relay 32 is connected. When the voltage V1 exceeds the determination voltage H in the predetermined period of time Tb1 (reference numeral b), that is, when a voltage rise between the power receiving terminals 29a and 29b is confirmed with the connection of the first relay 32, it is determined that no fusion failure occurs at the first relay 32. On the other hand, when the voltage Vb does not rise to the determination voltage H in the predetermined period of time Tb1, that is, when the predetermined voltage rise is not confirmed with the connection of the first relay 32, it is determined that a fusion failure occurs at the first relay 32. If a fusion failure is thus detected, the warning lamp 53 illuminates to notify a driver of the occurrence of the failure. Then, the second relay 33 is switched to the disconnection state while the first relay 32 is kept in the connection state. It is determined whether or not the voltage Vb falls below the predetermined determination voltage L within a predetermined time Ta2 (for example, one second) in which the second relay 33 is disconnected. When the voltage Vb falls below the determination voltage L in the predetermined period of time Ta2 (reference numeral c), that is, when a voltage drop between the power receiving terminals 29a and 29b is confirmed with the disconnection of the second relay 33, it is determined that no weld failure occurs at the second relay 33. On the other hand, when the voltage Vb does not fall below the determination voltage L in the predetermined period of time Ta2, that is, when the predetermined voltage drop is not confirmed with the disconnection of the second relay 33, it is determined that a weld failure occurs at the second relay 33. If a weld failure is thus detected, the warning lamp 53 illuminates to notify a driver of the occurrence of the failure.

Figure 8:
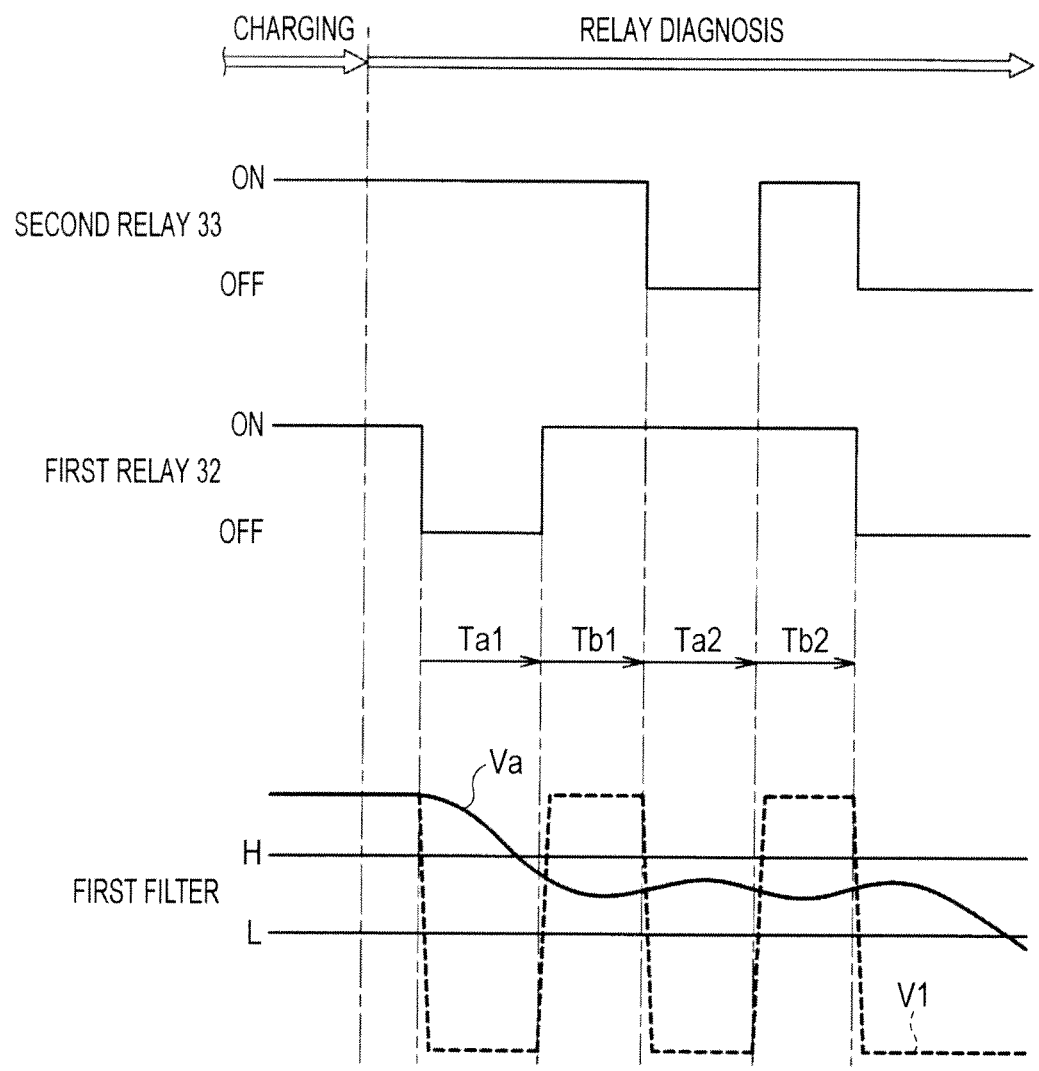
FIG. 8 is an explanatory diagram showing a diagnosis state in which the relay diagnosis control is executed with a voltage that is generated by applying a first filter.
Figure 9:
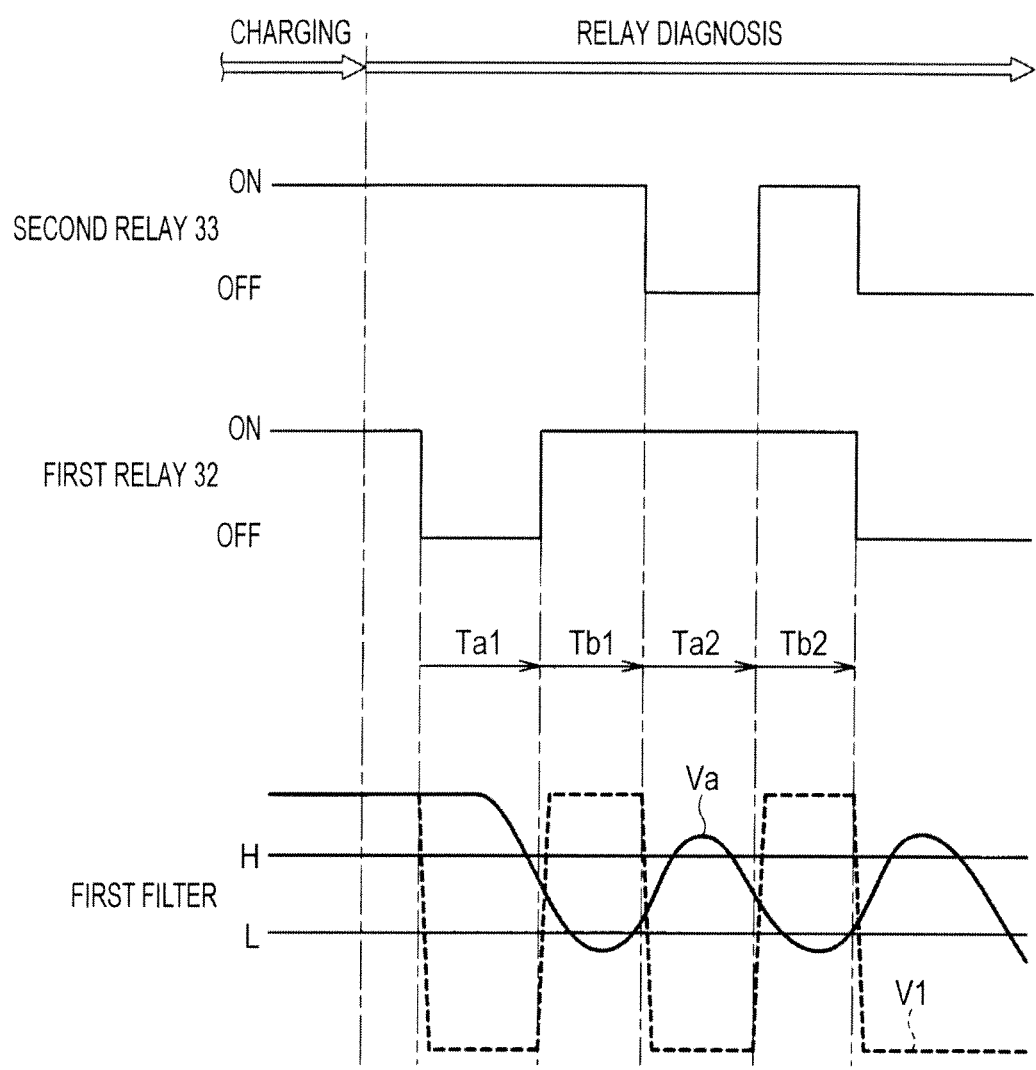
FIG. 9 is an explanatory diagram showing a diagnosis state in which the relay diagnosis control is executed with a voltage that is generated by applying a first filter.

Then, the second relay 33 is switched to the connection state while the first relay 32 is kept in the connection state. Within a predetermined time Tb2 (for example, 0.5 seconds) in which the second relay 33 is connected, it is determined whether or not the voltage Vb exceeds the predetermined determination voltage H. When the voltage Vb exceeds the determination voltage H in the predetermined period of time Tb2 (reference numeral d), that is, when a voltage rise between the power receiving terminals 29a and 29b is confirmed with the connection of the second relay 33, it is determined that no fusion failure occurs at the second relay 33. On the other hand, when the voltage Vb does not rise to the determination voltage H in the predetermined period of time Tb2, that is, when the predetermined voltage rise is not confirmed with the connection of the second relay 33, it is determined that a fusion failure occurs at the second relay 33. If a fusion failure is thus detected, the warning lamp 53 illuminates to notify a driver of the occurrence of the failure. In this manner, upon the relay diagnosis control the voltage V1 is processed with the second filter having a higher responsiveness than the first filter used upon charging, and the voltage Vb generated by applying the second filter is used for the relay diagnosis control, whereby it is possible to swiftly and reliably execute the relay diagnosis control. FIGS. 8 and 9 are explanatory diagrams showing a diagnosis state in which the relay diagnosis control is executed with the voltage Va which is generated by applying the first filter. As shown in FIG. 8, when the voltage Va which is generated by applying a first filter having a large time constant is used, the voltage Va cannot be raised or lowered in the predetermined periods of time Ta1, Tb1, Ta2 and Tb2 even if no weld failure or fusion failure occurs. Thus, it is difficult to swiftly and reliably detect a weld failure and a fusion failure of the relays 32 and 33. Furthermore, as shown in FIG. 9, even when the voltage Va which is generated by applying a first filter having a large delay is used, the voltage Va cannot be raised or lowered in the predetermined periods of time Ta1, Tb1, Ta2 and Tb2, whereby it is difficult to swiftly and reliably detect a weld failure and a fusion failure of the relays 32 and 33. As shown in FIG. 7, on the other hand, when the voltage Vb which is generated by applying the second filter having a higher responsiveness than the first filter, the voltage Va can be raised or lowered in the predetermined periods of time Ta1, Tb1, Ta2 and Tb2, whereby it is possible to swiftly and reliably detect a weld failure and a fusion failure of the relays 32 and 33.

Figure 10:
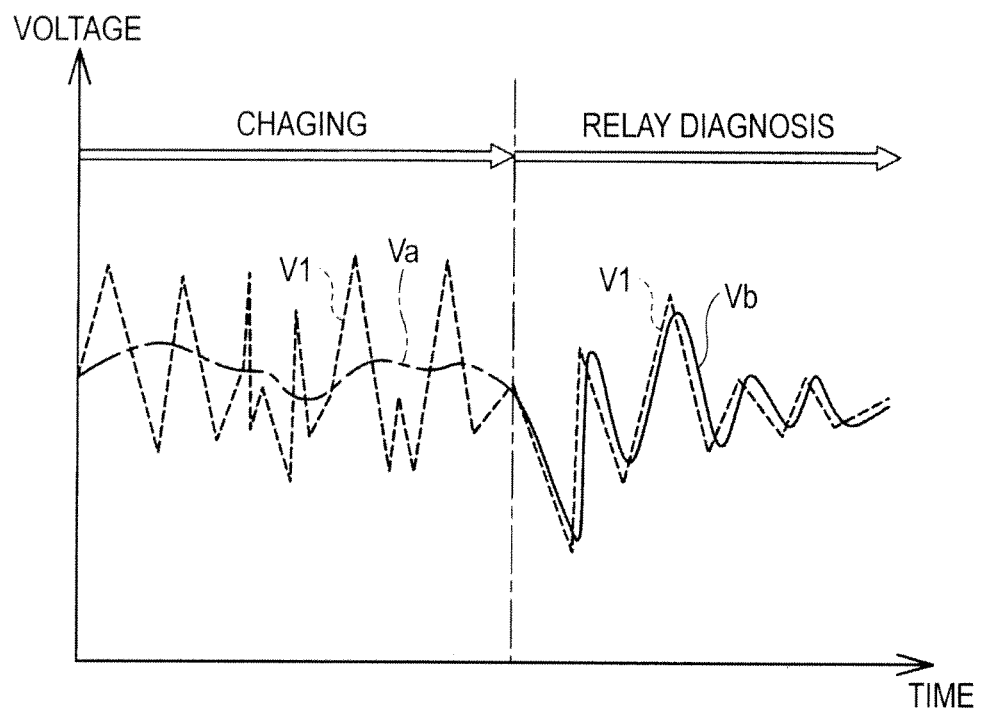
FIG. 10 is an explanatory diagram showing a characteristic difference between a first filter and a second filter.

FIG. 10 is an explanatory diagram showing a characteristic difference between the first filter and the second filter. Upon charging when large charging current is supplied from the power controller 41, large noise is generated in a voltage signal from the voltage sensor 45. Thus, the first filter that has a larger time constant or a larger delay is used, whereby, as shown in FIG. 10, the voltage V1 is converted to the voltage Va with a filtering characteristic that emphasizes stability. Upon the relay diagnosis when power supply from the power controller is interrupted, on the other hand, large noise is not generated in a voltage signal from the voltage sensor 45. Thus, the second filter that has a smaller time constant or a smaller delay is used, whereby, the voltage V1 is converted to the voltage Vb with a filtering characteristic that emphasizes responsiveness. By switching the filter for charging and the filter for the relay diagnosis, it is possible to highly accurately detect an absolute value of the voltage using the stability-oriented filtering characteristic upon charging, while, upon the relay diagnosis, it is possible to swiftly detect a relative change in the voltage using the responsiveness-oriented filter.

In the above description, the determination voltage H in the relay diagnosis control is set to 300 V as an example. This is because the terminal voltage of the battery 13 becomes 300 V when the SOC is 0%. That is, regardless of the SOC of the battery 13, the terminal voltage of the battery 13 is kept at 300 V or higher. Accordingly, if the relays 32 and 33 are connected, a voltage of 300 V or higher is immediately detected by the voltage sensor 45. Thus, the determination voltage is set to 300 V which is the lower limit voltage. By setting the determination voltage to the lower limit voltage of the battery 13, it is possible to reliably detect a fusion failure at the relays 32 and 33 with a shorter time for determination. The determination voltage H is not limited to 300V, and a different value that is equal to or higher than the lower limit voltage of the battery 13 may be used. Furthermore, the determination voltage L in the relay diagnosis control is set to 270 V as an example, but is not limited to this. A different value that is lower than the lower limit voltage of the battery 13 may be used.

Figure 11:
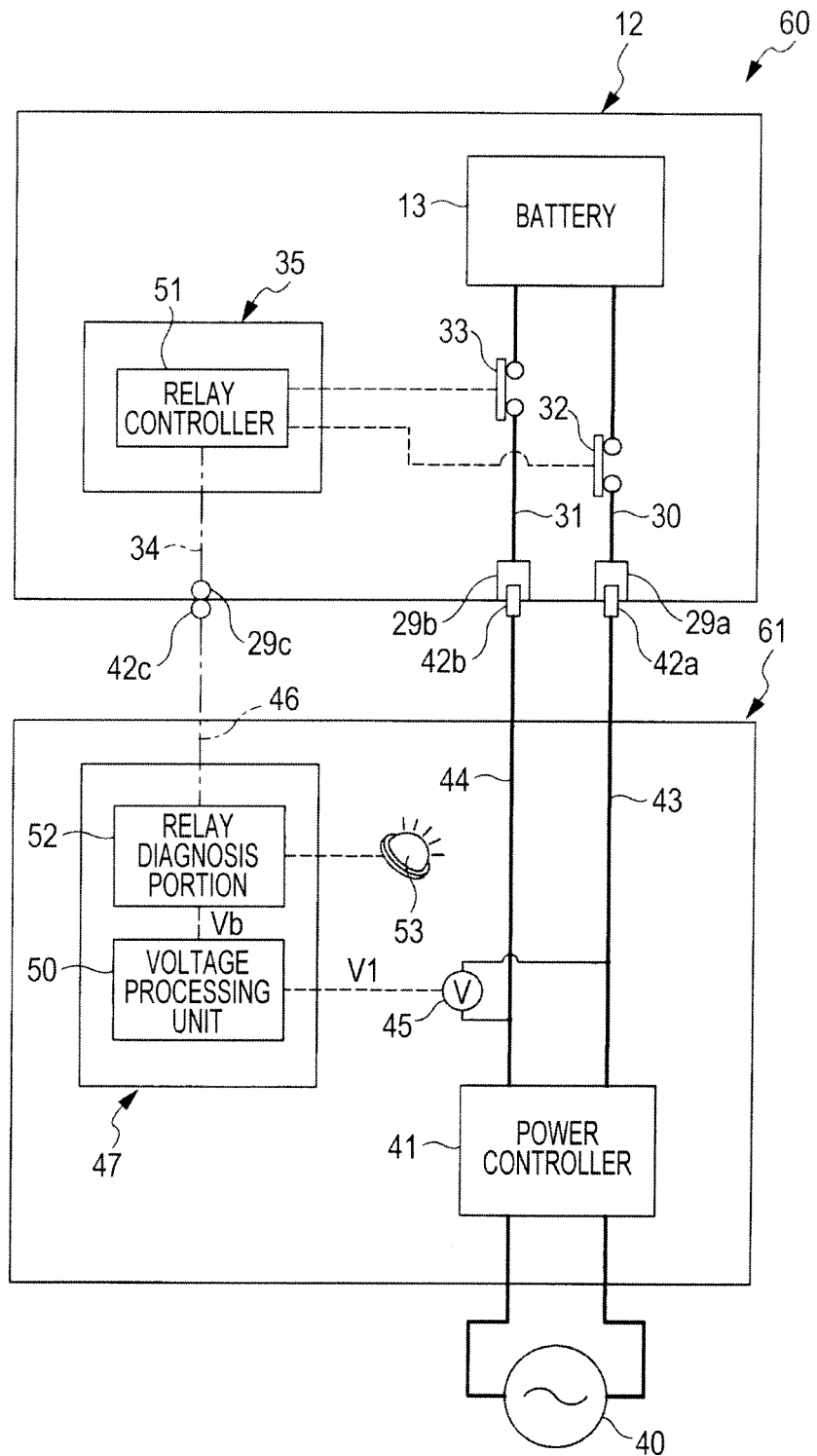
FIG. 11 is a schematic diagram showing main parts in an electric charging system according to another embodiment of the present invention.

In FIG. 6, the relay diagnosis portion 52 is installed in the vehicle control unit 35, but the present invention is not limited to this. Alternatively, the relay diagnosis portion 52 may be installed in the charging control unit 47. FIG. 11 is a schematic diagram showing main parts in an electric charging system 60 according to another embodiment of the present invention. The electric charging system 60 shown in FIG. 11 is configured with an electric charger 61 according to the another embodiment. In FIG. 11, components that are identical to components shown in FIG. 6 are denoted by like reference numerals, and descriptions thereof are omitted.

As shown in FIG. 11, the relay controller 51 is installed in the vehicle control unit 35 of the electric vehicle 12, while the voltage processing unit 50 and the relay diagnosis portion 52 are installed in the charging control unit 47 of the electric charger 61. When the charging system 60 executes the relay diagnosis control, the relay controller 51 inputs a controlled state of each of the relays 32 and 33 to the relay diagnosis portion 52 via the communication line 46. The relay diagnosis portion 52 also receives the voltage Vb which is generated by applying the second filter from the voltage controller 50. Then the relay diagnosis portion 52 checks for a weld failure and a fusion failure of the relays 32 and 33 based on a change in the voltage Vb due to switching of the relays 32 and 33. In this manner, even in the case where the relay diagnosis portion 52 is installed in the charging control unit 47, a similar effect to that of the previous embodiment can be obtained by switching the filtering characteristic by the voltage processing unit 50 upon charging and upon the relay diagnosis.

Figure 12:
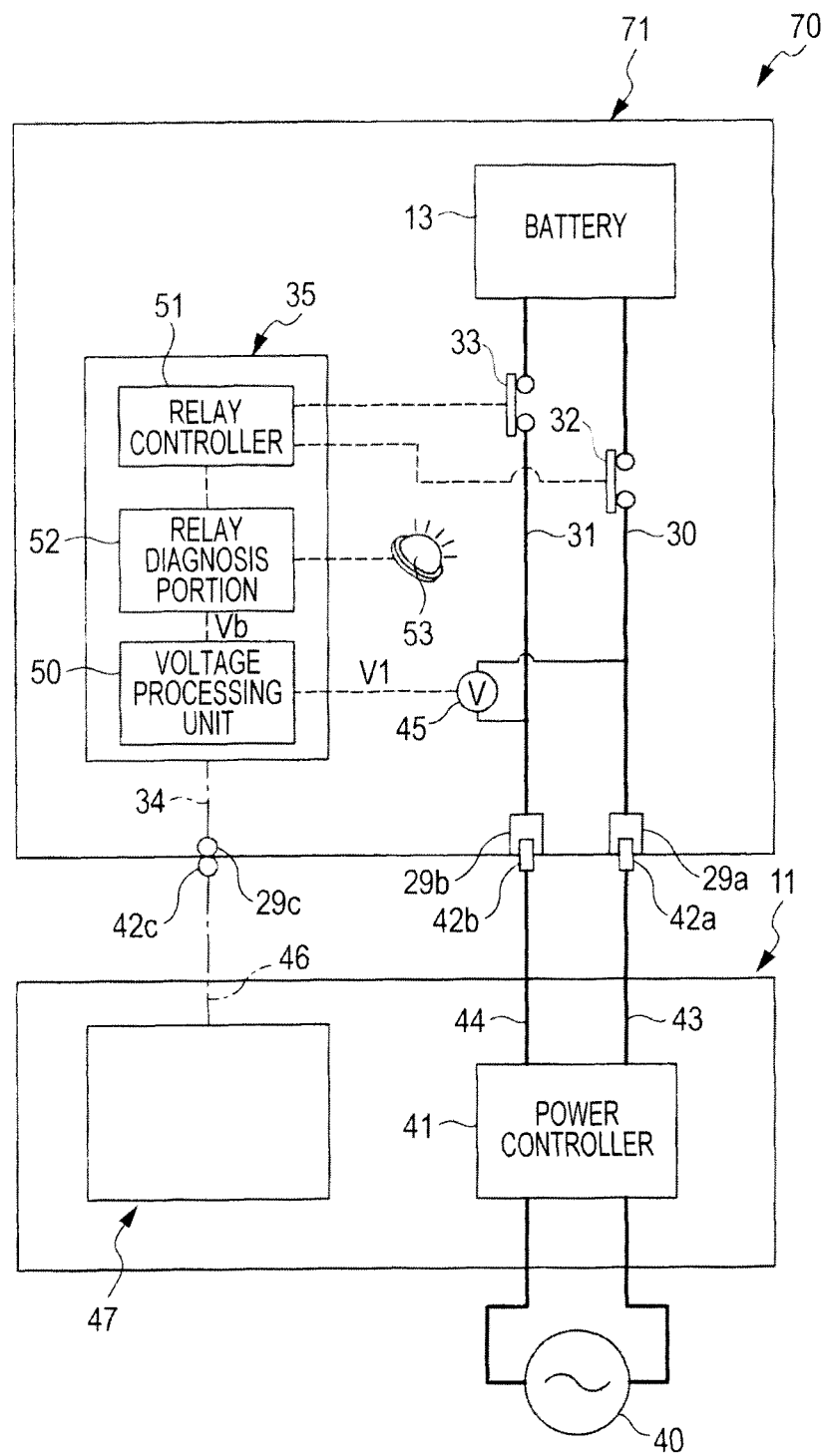
FIG. 12 is a schematic diagram showing main parts in an electric charging system according to another embodiment of the present invention.

While in FIG. 6 the voltage sensor 45 is disposed in the electric charger 11 and the voltage processing unit 50 is installed in the charging control unit 47, the present invention is not limited to this. Alternatively, the voltage sensor 45 may be disposed in the electric vehicle 12 and the voltage processing unit 50 may be installed in the vehicle control unit 35. FIG. 12 is a schematic diagram showing main parts in an electric charging system 70 according to another embodiment of the present invention. The electric charging system shown in FIG. 12 is configured with an electric vehicle 71 according to the another embodiment. In FIG. 12, components that are identical to components shown in FIG. 6 are denoted by like reference numerals, and descriptions thereof are omitted.

As shown in FIG. 12, the electric vehicle 71 has the voltage sensor 45 that measures the voltage V1 between the power receiving lines 30 and 31. The voltage processing unit 50, the relay controller 51 and the relay diagnosis portions are installed in the vehicle control unit 35. When the electric charging system 70 executes the relay diagnosis control, the relay controller 51 in the vehicle control unit 35 inputs a controlled state of each of the relays 32 and 33 to the relay diagnosis portion 52 in the same vehicle control unit 35. The relay diagnosis portion 52 also receives the voltage Vb which is generated by applying the second filter from the voltage controller 50 in the same vehicle control unit 35. Then the relay diagnosis portion 52 checks for a weld failure and a fusion failure of the relays 32 and 33 based on a change in the voltage Vb due to switching of the relays 32 and 33. In this manner, even in the case where the voltage sensor 45 is disposed in the electric vehicle 71 and the voltage processing unit 50 is installed in the vehicle control unit 35, a similar effect to that of the previous embodiment can be obtained by switching the filtering characteristic by the voltage processing unit 50 upon charging and upon the relay diagnosis.

The present invention is not limited to the above-described embodiments. It will be apparent to those skilled in the art that various changes may be made without departing from the scope of the invention. While the above description performs the relay diagnosis control after charging of the battery 13 is complete, the present invention is not limited to this. Alternatively, the relay diagnosis control may be performed before charging the battery 13. Further, moving averaging and weighted averaging are referred to as the filter process executed by the voltage controller 50, but the present invention is not limited to these methods. Furthermore, filtering may be applied in a hardware sense using an electric circuit or in a software sense using a program. Furthermore, a plurality of filters to be used upon charging may be prepared and one of the filters may be selected and used depending on a charging state.

The illustrated electric vehicle 12 is an electric vehicle which only has the motor-generator 20 for propulsion, but may be a hybrid-type electric vehicle that includes a motor-generator and an engine for propulsion. Further, the battery 13 which is a lithium-ion rechargeable battery, a nickel metal hydride rechargeable battery or the like is used as the electric storage device, but the present invention is not limited to this. Alternatively, a capacitor such as a lithium-ion capacitor and an electric double layer capacitor may be used as the electric storage device. Furthermore, while in the above description the positive electrode and the negative electrode of the battery 13 are provided with the relays 32 and 33 respectively, the present invention can be applied to an electric vehicle that only has the relay 32 at the positive electrode and an electric vehicle that only has the relay 33 at the negative electrode. However, from a viewpoint of improvement in safety during the charging operation, it is preferable that both the positive and negative electrodes of the battery 13 should be provided with the relays 32 and 33 respectively.

What is claimed is:

1. An electric charging system in which an electric vehicle is provided with a charging port that is connected to an electric storage device, and an electric charger that has an electric controller generating supply power is connected to the charging port, and the electric charger is used to charge the electric storage device, the electric charging system comprising:
   a pair of current carrying lines that connects the electric storage device and the power controller via the charging port and supplies charging power to the electric storage device from the power controller;
   a relay that is disposed on at least either one of the pair of the current carrying lines between the electric storage device and the charging port and is switched between a connection state and a disconnection state;
   a voltage measure that is connected to the pair of the current carrying lines between the relay and the power controller and measures a voltage between the current carrying lines;
   a relay diagnosis unit that, under a state where charging of the electric storage device is interrupted, switches the relay to the connection state or the disconnection state and examines a failure state of the relay based on a change in the voltage due to switching of the relay; and
   a voltage processor that processes the voltage with a first filter when the electric storage device is charged and processes the voltage with a second filter that has a higher responsiveness than the first filter when a failure diagnosis of the relay is performed based on the change in the voltage due to switching of the relay.

2. An electric vehicle that has a charging port detachably connected to an electric charger and is equipped with an electric storage device connected to the charging port via a pair of current carrying lines, the electric vehicle comprising:
   a relay that is disposed on at least either one of the pair of the current carrying lines and is switched between a connection state and a disconnection state;
   a voltage measure that is connected to the pair of the current carrying lines between the relay and the charging port and measures a voltage between the current carrying lines; and
   a voltage processor that processes the voltage measured by the voltage measure with a predetermined filter,
   wherein the voltage processor processes the voltage with a first filter when the electric charger is connected to the charging port to charge the electric storage device, and
   wherein the voltage processor processes the voltage with a second filter that has a higher responsiveness than the first filter when, under a state the power supply from the power controller is interrupted, the relay is switched to a connection state or a disconnection state and a failure diagnosis of the relay is performed based on a change in the voltage due to switching of the relay.

3. An electric charger that, when in use, is connected to an electric vehicle that includes an electric storage device connected to a charging port via a pair of power receiving lines and a relay disposed on at least either of the pair of the power receiving lines, the electric charger comprising:
   a connector that is attachable and detachable to the charging port;
   a power controller that is connected to the connector via a pair of power supply lines and generates charging power;
   a voltage measure that is connected to the pair of the power supply lines and measures a voltage between the power supply lines; and
   a voltage processor that processes the voltage measured by the voltage measure with a predetermined filter,
   wherein the voltage processor processes the voltage with a first filter when the power controller supplies supply power from the power controller to charge the electric storage device under a state where the connector is connected to the charging port, and
   wherein the voltage processor processes the voltage with a second filter that has a higher responsiveness than the first filter when, under a state the connector is connected to the charging port and the power supply from the power controller is interrupted, the relay is switched to a connection state or a disconnection state and a failure diagnosis of the relay is performed based on a change in the voltage due to switching of the relay.

* * * * *